United States Patent
Yau et al.

(10) Patent No.: US 7,216,319 B1
(45) Date of Patent: May 8, 2007

(54) REGIONAL CLOCK SKEW MEASUREMENT TECHNIQUE

(75) Inventors: Dang Yun Yau, Saratoga, CA (US); Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 215 days.

(21) Appl. No.: 10/981,958

(22) Filed: Nov. 5, 2004

(51) Int. Cl.
*G06F 17/50* (2006.01)

(52) U.S. Cl. .......................... 716/6; 716/16
(58) Field of Classification Search ............ 716/6, 716/16–17
See application file for complete search history.

(56) References Cited

U.S. PATENT DOCUMENTS

| | | | | |
|---|---|---|---|---|
| 5,204,559 A | * | 4/1993 | Deyhimy et al. | 327/232 |
| 5,268,656 A | * | 12/1993 | Muscavage | 331/45 |
| 5,373,535 A | * | 12/1994 | Ellis et al. | 375/354 |
| 5,396,129 A | * | 3/1995 | Tabira | 326/93 |
| 5,586,307 A | * | 12/1996 | Wong et al. | 713/400 |
| 5,696,953 A | * | 12/1997 | Wong et al. | 713/601 |
| 6,075,419 A | | 6/2000 | Sun et al. | 331/57 |
| 6,437,597 B1 | * | 8/2002 | Chan | 326/16 |
| 6,583,659 B1 | * | 6/2003 | Kwong et al. | 327/295 |
| 6,859,106 B2 | * | 2/2005 | Sano | 331/1 A |
| 6,862,548 B1 | * | 3/2005 | Chan | 702/125 |
| 6,871,335 B1 | * | 3/2005 | Chan | 716/6 |
| 6,914,492 B2 | * | 7/2005 | Hui et al. | 331/57 |
| 6,952,813 B1 | * | 10/2005 | Rahut | 716/6 |
| 6,983,394 B1 | * | 1/2006 | Morrison et al. | 713/500 |
| 7,129,765 B2 | | 10/2006 | Vadi et al. | |
| 2005/0068110 A1 | * | 3/2005 | Hui et al. | 331/1 A |
| 2005/0286565 A1 | * | 12/2005 | Vakil et al. | 370/503 |

OTHER PUBLICATIONS

Xilinx, Inc.; U.S. Appl. No. 10/981,877; filed Nov. 5, 2004; inventors: Bergendahl et al.

* cited by examiner

*Primary Examiner*—Stacy A Whitmore
(74) *Attorney, Agent, or Firm*—Scott Hewett

(57) ABSTRACT

In an embodiment of the present invention, an integrated circuit ("IC"), such as a field-programmable gate array ("FPGA") or a complex programmable logic device ("CPLD"), has a global clock buffer coupled to a first regional clock buffer through a first global clock spine. A first flip-flop is close to a first end of a first regional clock spine, and is coupled to a circuit block, such as a configurable logic block. The circuit block is coupled to the global clock buffer through a first routing portion and a second routing portion couples the first flip-flop to the circuit block so as to form a first clock ring allowing measurement of a first clock ring delay. In further embodiments, additional clock rings are configured in the IC, allowing measurements of additional clock ring delays. In suitably symmetric devices, skew along the regional clock spine is calculated from the clock ring delays.

15 Claims, 6 Drawing Sheets

US 7,216,319 B1

REGIONAL CLOCK SKEW MEASUREMENT TECHNIQUE

FIELD OF THE INVENTION

This invention relates generally to integrated circuits, and more particularly to measuring clock skew in a programmable logic device.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

PLDs and other logic devices have functional blocks that are physically separate on the IC chip operating off a common clock signal. The PLD has a clock distribution network (clock "tree") designed to provide the clock signal to various portions of the IC chip with minimal clock skew. Clock skew is the deviation from ideality of the clock signal at a particular location on the PLD relative to a reference clock signal, such as the clock signal provided to a clock tree or the clock signal present at the clock driver output of the PLD. The clock signal at the particular location is typically delayed from the reference clock signal, and the clock skew is expressed in time, such as in pico-seconds ("ps") of delay. For example, if a rising clock edge occurs at time=0 on the reference clock signal, the rising clock edge might occur a few hundred ps later elsewhere on clock tree.

SUMMARY OF THE INVENTION

In an embodiment of the present invention, an integrated circuit ("IC"), such as a field-programmable gate array ("FPGA") or a complex programmable logic device ("CPLD"), has a global clock buffer coupled to a first regional clock buffer through a first global clock spine. A first flip-flop is close to a first end of a first regional clock spine, and is coupled to a circuit block, such as a configurable logic block ("CLB"). The CLB is coupled to the global clock buffer through a first routing portion and a second routing portion couples the first flip-flop to the CLB so as to form a first clock ring allowing measurement of a first clock ring delay. In further embodiments, additional clock rings are configured in the IC, allowing measurements of additional clock ring delays. In suitably symmetric devices, skew along the regional clock spine is calculated from the clock ring delays.

DETAILED DESCRIPTION OF THE DRAWINGS

PLDs often have many regions operating on their own regional clock signals. A global clock tree provides the clock signal to regional clock trees, which in turn provide the clock signal throughout a regional circuit. For example, the global clock tree extends along a center line of the chip, connected to regional clock trees on either side in a symmetrical fashion that branch out from the left or right edge of the chip. This arrangement decreases skew within a regional circuit, compared to directly clocking the regional circuits off of the global clock tree. Sometimes, a regional clock tree is used to distribute the clock signal to several regional circuits. In such arrangements, the skew on the clock distribution network extending along lines parallel to the center line of the chip is called "vertical" skew, and the skew on the clock distribution network extending along lines at right angles to the center line of the chip is called "horizontal" skew.

One way to measure clock delay inside an FPGA is to use a built-in self test ("BIST") ring. Clock skew on a symmetrical clock tree can be deduced by measuring delay at various points of the global clock tree using a BIST ring. Programmable interconnections are used to connect the clock output back to the clock driver to complete the BIST ring. For example, a BIST ring path is configured through available chip resources, such as hex lines, double lines, long lines, and CLBs having flip-flops.

Typically, about twenty parameters are summed to obtain a total delay around the ring. The ring is re-configured several times to obtain, e.g. twenty equations with twenty solutions (i.e. measured delays). Linear algebra is used to solve for the delay of the desired link (parameter) in the BIST ring. However, the errors in the measurements for the programmable connections can be large compared to the clock skew that is being measured. In one example, the clock distribution network is designed with a maximum clock skew in the range of 100 ps. Further discussion of using BIST ring techniques to measure clock skew of a symmetrical global clock network is found in U.S. patent application Ser. No. 10/021,448, entitled METHODS AND CIRCUITS FOR MEASURING CLOCK SKEW ON PROGRAMMABLE LOGIC DEVICES, filed Oct. 30, 2001 by Siuki Chan, and in U.S. patent application Ser. No. 10/021,447, entitled METHODS AND CIRCUITS FOR MEASURING CLOCK SKEW ON PROGRAMMABLE LOGIC DEVICES, filed Oct. 30, 2001 by Siuki Chan, the disclosures of which are hereby incorporated by reference for all purposes.

Figure 1A:
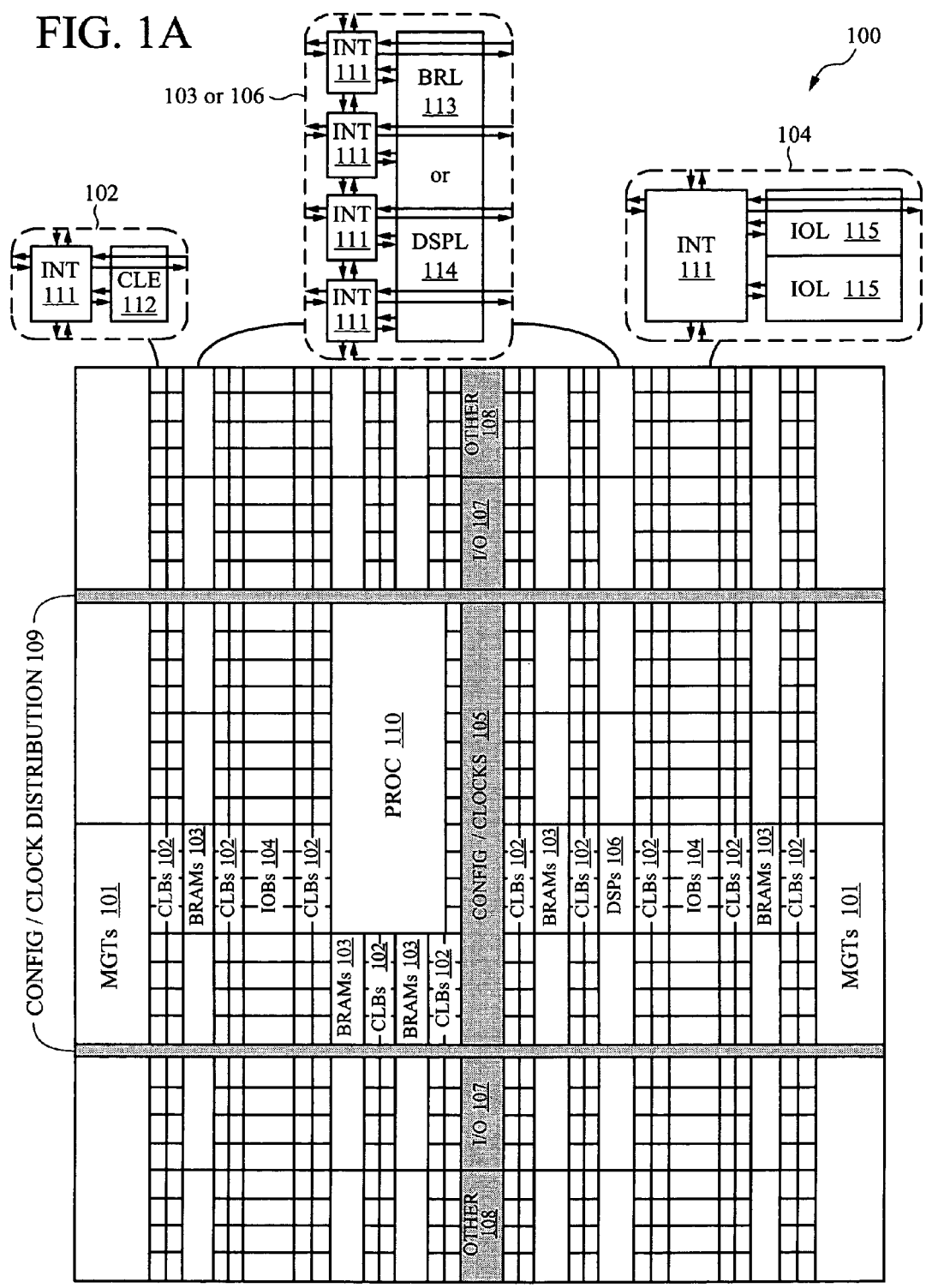
FIGS. 1A and 1B are simplified plan diagrams of FPGAs suitable for being configured into or operating according to embodiments of the invention.

FIG. 1A is a simplified plan diagram of an integrated circuit ("IC") known as an FPGA 100, such as a VIRTEX™ IV FPGA manufactured by XILINX, Inc., which is suitable for being configured into or operating according to embodiments of the invention. FIG. 1A FIG. 1A illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

Each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1A.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1A) is used for configuration, global clock, and other control logic. Horizontal areas 109 extending from this column are used to distribute the clocks and configuration signals across the breadth of the FPGA. As illustrated the global clock first propagates down the central vertical spine and then extends out via the horizontal spines, e.g., 109.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, the processor block PROC 110 shown in FIG. 1A spans several columns of CLBs and BRAMS.

Note that FIG. 1A is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1A are purely exemplary. For example, in an actual FPGA more than one adjacent column of CLBs is typically included wherever the CLBs appear, to facilitate the efficient implementation of user logic.

A further description of the global clock tree is disclosed in co-pending U.S. patent application Ser. No. 10/836,722, entitled "A Differential Clock Tree in an Integrated Circuit," by Vasisht M. Vadi, et. al., filed Apr. 30, 2004, which is herein incorporated by reference.

Figure 1B:
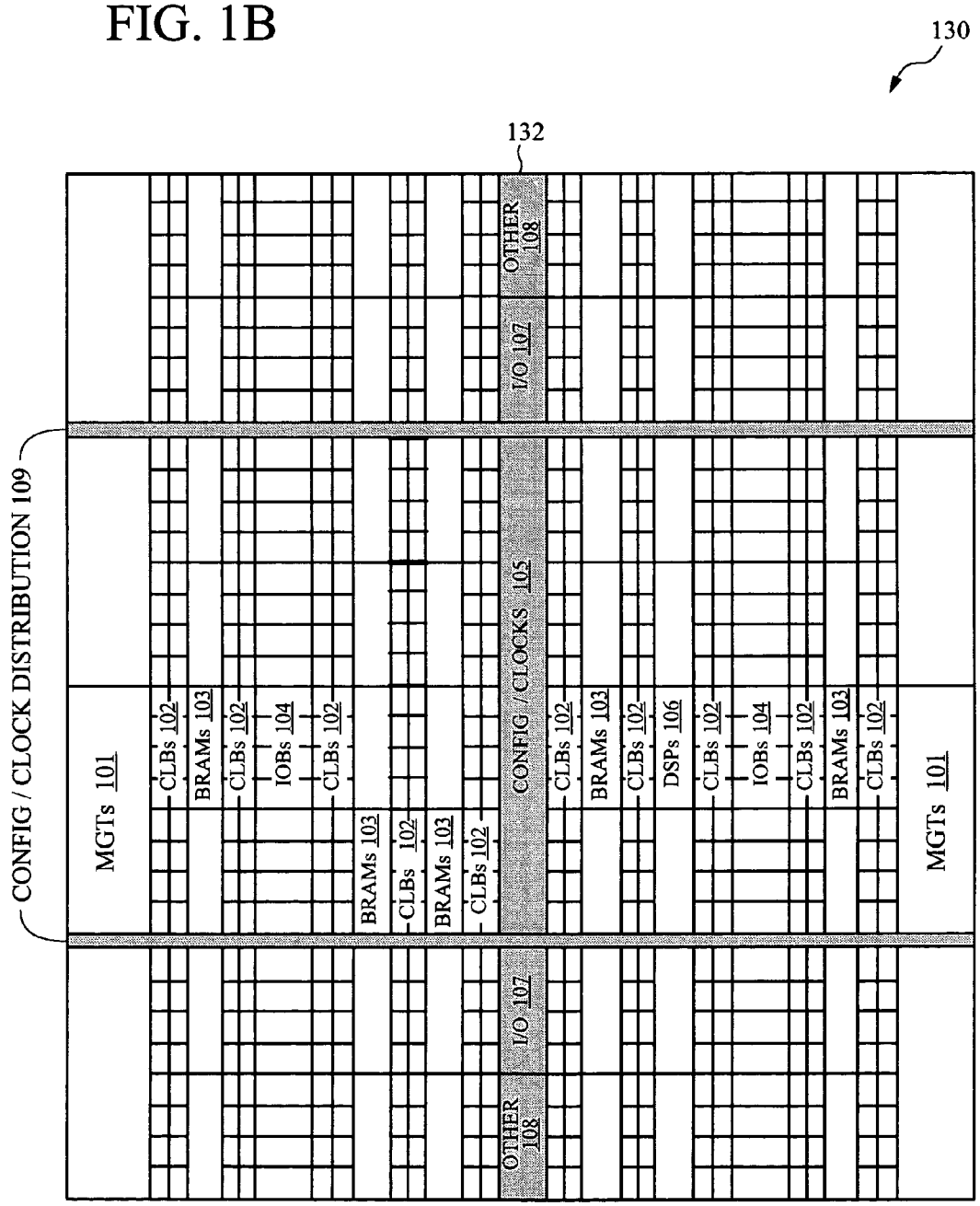

In one embodiment, FPGA 130 of FIG. 1B has the processor block 110 of FIG. 1A replaced by extending the BRAM 103 and CLB 102 columns into the area occupied by the Proc 110. In this case FPGA 130 is symmetric. In particular, the top half is essentially a mirror image of the bottom half, and the right half is essentially a mirror image of the left half. Arranging physically large ICs in a symmetric fashion allows convenient clock distribution from a global clock, such as from or near a center column 132 of the FPGA 130. Furthermore, similarly positioned functional blocks within opposite halves typically perform in a similar fashion in regards to delay, power consumption, and available routing resources.

In other embodiments, an IC does not have exact mirror symmetry. For example, an IC having a large embedded block, such as an embedded microprocessor (e.g., Proc 100 in FIG. 1A), does not have a similar embedded block in its opposite half. However, embodiments of the invention operate in ICs without exact mirror symmetry if the functional blocks in question (e.g. the ones being tested for regional clock skew) essentially have symmetry to each other. Alternatively, a CPLD or other IC arranged in an appropriately symmetrical pattern is used with embodiments of the invention.

Figure 2A:
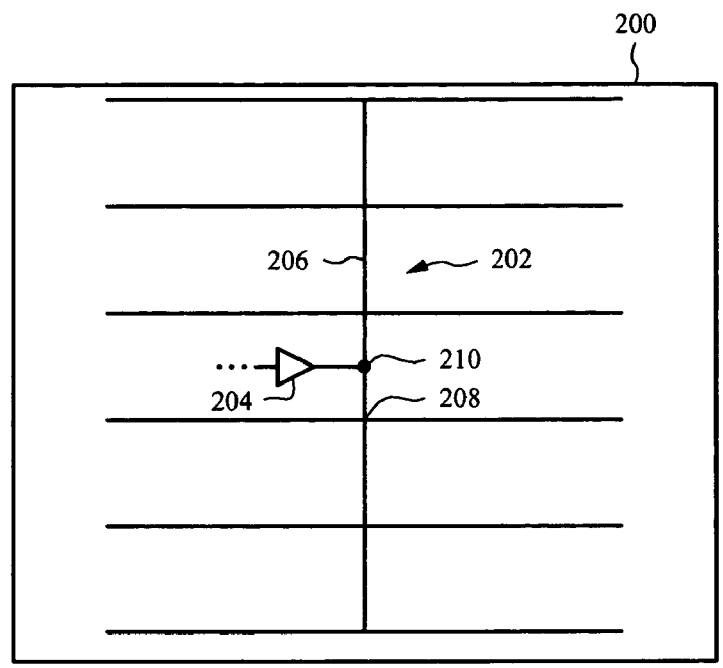
FIG. 2A is a simplified plan view diagram of an IC showing a symmetrical global clock tree.

FIG. 2A is a simplified plan view diagram of an IC 200, such as an FPGA 132 FIG. 1B, showing a symmetrical global clock tree 202. A global clock signal is provided to the global clock tree through a global clock buffer 204. For purposes only of convenient discussion and illustration, portions of the global clock tree and other elements will be referred to as "right, "left," "horizontal," and "vertical" as viewed from the sheets the figures are drawn upon.

The global clock tree 202 includes a vertical "center trunk" (also called a "main trunk", "backbone," or by other names) 206 and horizontal "spines" (also called "branches" or by other names) 208. The global clock tree is symmetrical about the drive point 210 from the global clock buffer 204, which is in the center of the IC (chip) 200. In the symmetrical global clock tree, clock skew can be deduced by measuring delay at various points of the global clock tree 202 using a BIST ring. Programmable interconnections (not separately shown) on the IC are used to connect the clock output back to the clock driver 204.

Some FPGAs incorporate asymmetric clock distribution, such as asymmetrical regional clock trees whose clock driver(s) are not in the center of the chip. Other techniques for measuring clock skew in asymmetrical clock trees are desirable, particularly when measuring relatively small delays, such as 100 Ps.

Figure 2B:
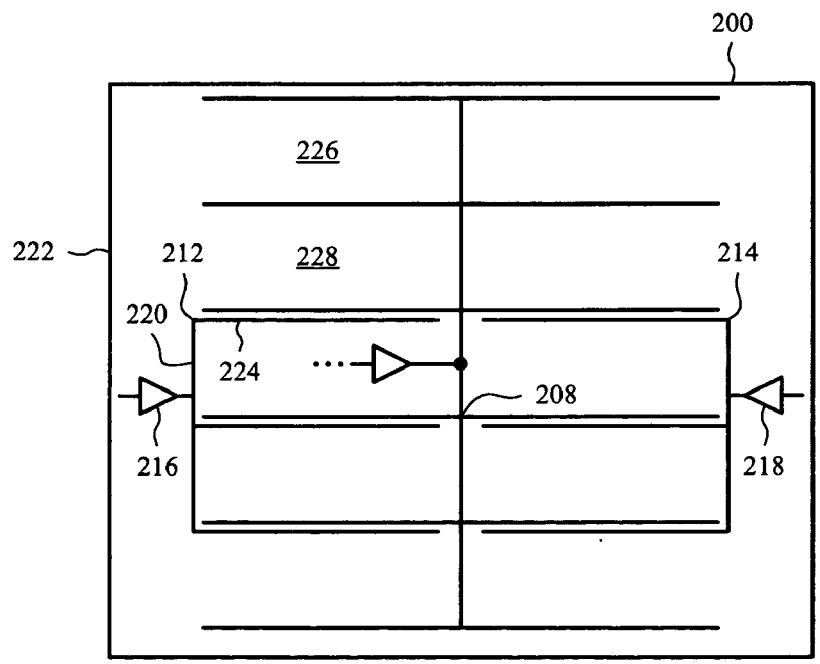
FIG. 2B is a simplified plan view diagram of the IC of FIG. 2A showing asymmetrical regional clock trees.

FIG. 2B is a simplified plan view diagram of the IC of 200 FIG. 2A showing asymmetrical regional clock trees 212, 214. The first regional clock tree 212 is driven by a first regional clock buffer 216 and the second regional clock tree 214 is driven by a second regional clock buffer 218. The first regional clock tree 212 has a trunk 220 extending along the left edge 222 of the IC 200, and regional clock tree spines 224 extending from the trunk 220 along the left edge 222 toward the center of the IC 200. The second regional clock tree 214 is similarly arranged, being essentially a mirror image of the first regional clock tree 212, and hence the two regional clock trees 212, 214 operate essentially identically (in terms of clock skew) to each other. As used herein, being essentially a mirror image means that the equivalent functional blocks do not require exact physical symmetry, but that each functional block operates about the same in terms of clock skew. Other regions 226, 228 of the IC 200 optionally have additional regional clock trees (not shown). A further description of the regional clocks is disclosed in U.S. provisional application Ser. No. 60/608,552, entitled "REGIONAL SIGNAL-DISTRIBUTION NETWORK FOR AN INTEGRATED CIRCUIT", by Jason Bergendahl, et. al., filed Sep. 10, 2004, which is herein incorporated by reference.

Figure 2C:
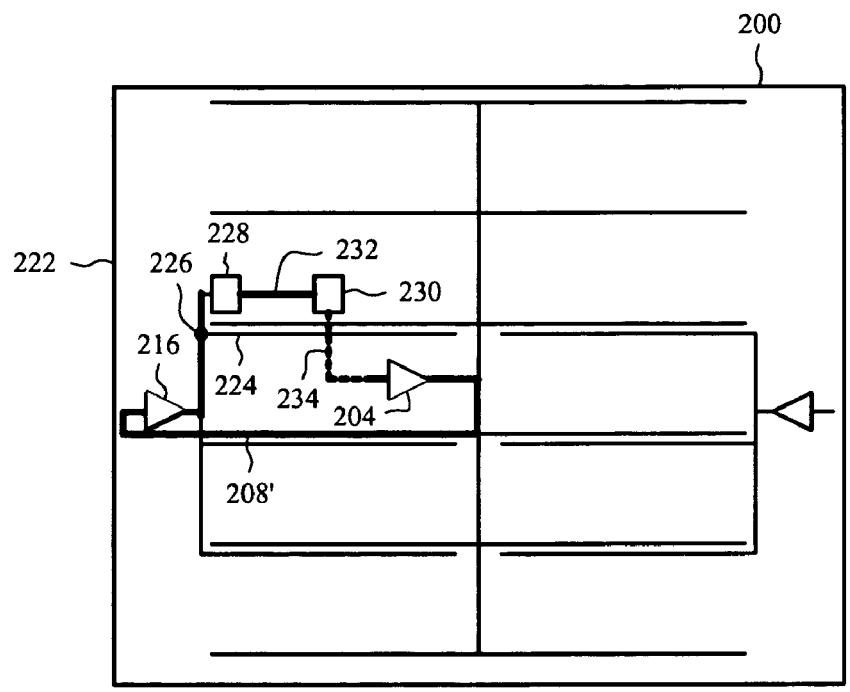
FIG. 2C is a simplified plan view diagram of the IC of FIG. 2B with a first clock ring formed with a global clock buffer and a first regional clock buffer.

FIG. 2C is a simplified plan view diagram of the IC 200 of FIG. 2B with a first clock ring formed with the global clock buffer 204 and the first regional clock buffer 216. The first clock ring is also referred to as a BIST ring, because all functions of the test are self-contained in the chip. The first BIST ring allows measurement of the delay around the clock ring by tapping a single point on the ring. For example, a data value or clock edge is provided at a node on the clock ring, and time it takes for the value or edge to travel around the clock ring is measured with an external test instrument tapped into the node, typically through the fabric of the device.

The global clock signal is provided to the first regional clock buffer 216 from the center spine 208' of the global clock tree. The regional-clock signal is tapped at a left tap 226 of the regional clock tree spine 224, which is near the left edge 222 of the IC 200 and is the end of the regional clock spine nearest to the regional clock buffer. A first edge flip-flop 228 is the closest flip-flop to the left (edge) tap 226. The first edge flip-flop 228 can be part of a first CLB.

The first edge flip-flop 228 is connected to a circuit block 230 with a left routing portion 232 (i.e. "first edge-to-block route"). The circuit block 230 may be a second CLB, which includes a CLE 112 and programmable interconnect element (INT 111), for example. The CLB, for example, propagates the signal and serves as a convergence point for the first portions of the test paths shown in FIGS. 2C and 2D. In other words, the test paths after the circuit block 230 are substantially identical in FIG. 2C and FIG. 2D. The circuit block 230 is connected to the input of the global clock buffer 204 with a configurable route portion 234 (i.e. "block-to-global clock buffer route"), which is shown as a dotted line. Hence, a ring path is completed from the global clock buffer 204 through the center spine 208' of the global clock tree to the regional clock buffer 216, and back to the input of the global clock buffer 204.

Figure 2D:
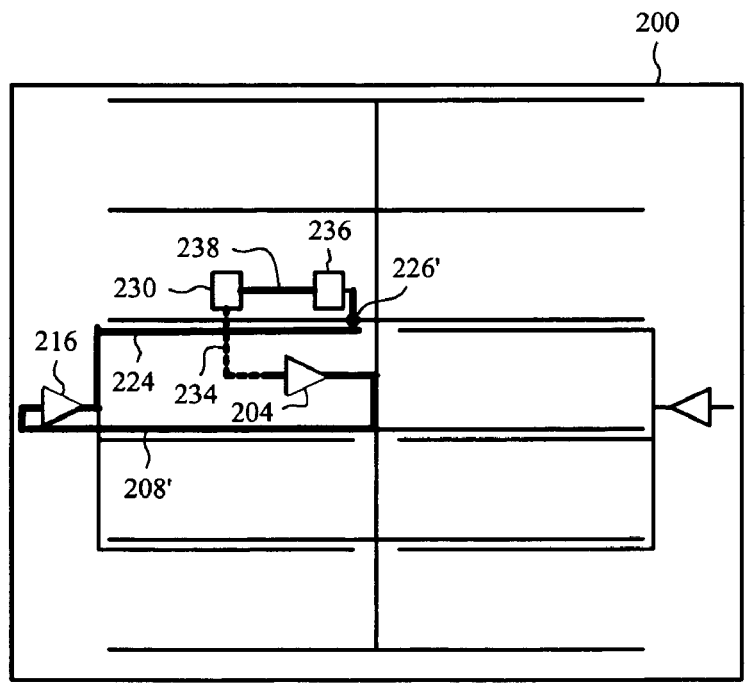
FIG. 2D is a simplified plan view diagram of the IC of FIG. 2B with a second clock ring formed with the global clock buffer and the first regional clock buffer.

FIG. 2D is a simplified plan view diagram of the IC 200 of FIG. 2B with a second clock ring formed with the global clock buffer 204 and the first regional clock buffer 216. In the second clock ring, the regional clock signal is tapped at a right tap 226', which is at the right end of the regional clock tree spine 224, near the center of the IC 200 and farthest from the regional clock buffer. The regional clock buffer 216 is driven by the global clock buffer 204 through center spine 208', as in FIG. 2C. Similarly, the configurable route portion 234 from the circuit block 230 to the input of the global clock buffer 204 is the same as in FIG. 2C.

A first center flip-flop 236 is the closest flip-flop to the right (center) tap 226'. The first center flip-flop 236 is connected to the circuit block 230 with a right routing portion 238 (i.e. "first center-to-block route").

Therefore, the ring delay of the second BIST ring minus the ring delay of the first BIST ring delay equals the skew from one end (i.e. the left tap point 226) to the other end (i.e. right tap point 226') of the regional clock tree spine 224 driven by regional clock buffer 216, plus the delay [R1] through the right routing portion 238 minus the delay [L1] through the left routing portion 232, which is represented as:

$$D2-D1=\text{skew}+(R1-L1) \qquad \text{Eq. 1}$$

The clock routing is carefully laid out to make the BIST ring paths as symmetrical as possible. In some embodiments, a differential clock is used so that rising edge has the same delay as the falling edge.

Figure 2E:
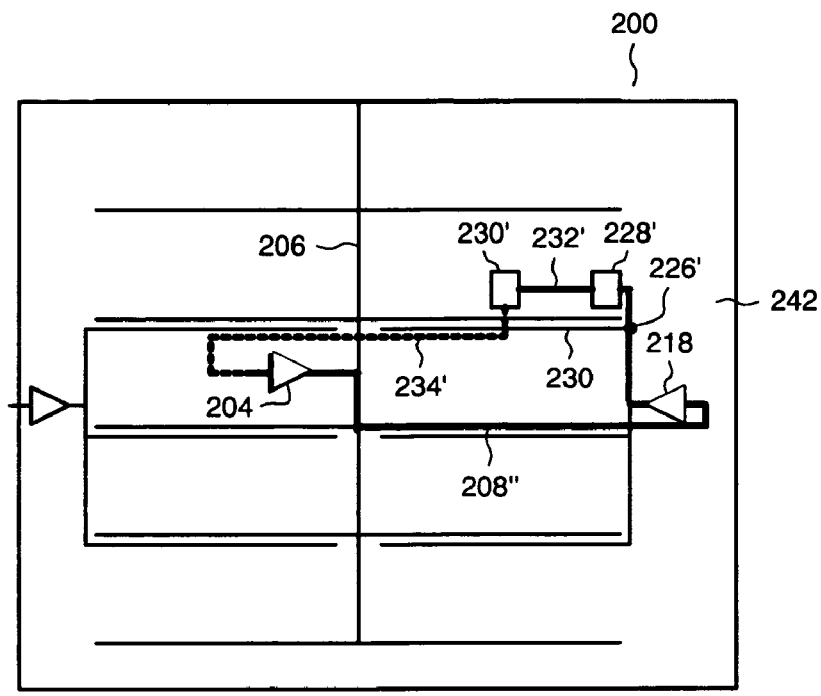
FIG. 2E is a simplified plan view diagram of the IC of FIG. 2B with a third clock ring formed with the global clock buffer and a second regional clock buffer.

FIG. 2E is a simplified plan view diagram of the IC 200 of FIG. 2B with a third clock ring formed with the global clock buffer 204 and the second regional clock buffer 218. The global clock signal is provided to the second regional clock buffer 218 from the center spine 208" of the global clock tree. The regional clock signal is tapped at a right tap 226', which on this side of the center trunk 206 of the global clock tree is close to the right edge 242 of the IC 200 and is the end of the horizontal regional clock spine nearest to the second regional clock buffer. A second edge flip flop 228' is the closet flip-flop to the right tap 226', or alternatively is reasonably close to the right tap 226'.

The second edge flip-flop 228' is connected to a second circuit block 230' with a second right routing portion 232' (i.e. "second edge-to-block route"), which is essentially the same in terms of clock skew as the left routing portion 232 shown in FIG. 2C, and in a symmetrical device is physically a mirror-image or near mirror-image of the left routing portion 232. Obtaining the same, or nearly the same, clock skew, in these routing portions is relatively straightforward for symmetric halves of the circuit. In other embodiments, the halves of the circuit are not completely symmetric; however, the routing portions are selected to provide essentially the same clock skew. The second circuit block 230' is connected to the input of the global clock buffer 204 with a second configurable route portions 234', which is shown as a dashed line. Hence a third ring path is completed from the global clock buffer 204 through the center spine 208" of the global clock tree to the input of the regional clock buffer 218 and back to the input of the global clock buffer 204.

Figure 2F:
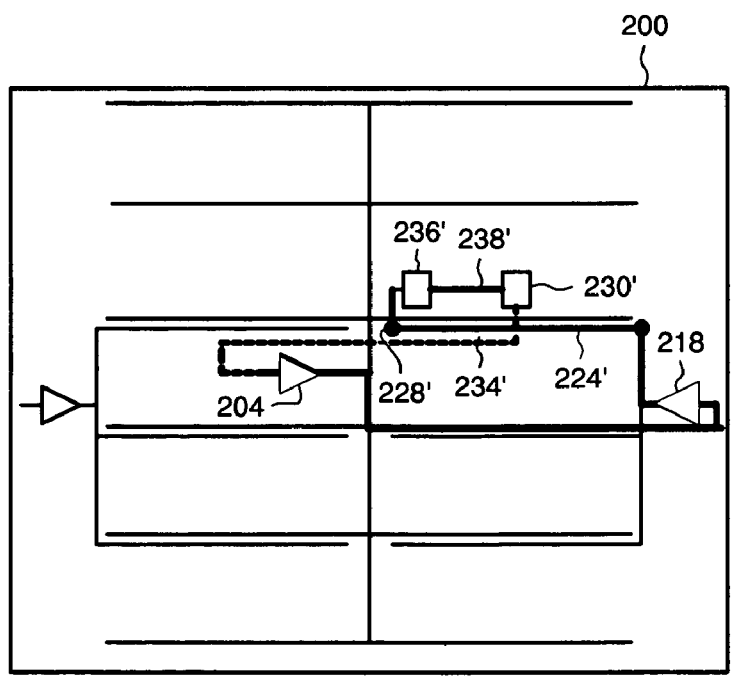
FIG. 2F is a simplified plan view diagram of the IC of FIG. 2B with a fourth clock ring formed with the global clock buffer and the second regional clock buffer.

FIG. 2F is a simplified plan view diagram of the IC 200 of FIG. 2B with a fourth clock ring formed with the global clock buffer 204 and the second regional clock buffer 218. In the fourth clock ring, the regional clock signal is tapped at a left tap 228' on the left end of the regional clock regional clock tree spine 224', at the end of the regional clock spine farthest from the second regional clock buffer. A second left flip-flop 236' is the closet flip-flop to the left tap 228', or alternatively is reasonably close to the left tap 228'.

The second left flip-flop 236' is connected to the circuit block 230' with a second left routing portion 238' (i.e. "second center-to-block route"). The second left routing portion is essentially identical to the right routing portion 238 ring shown in FIG. 2D. The circuit block 230' is connected to the input of the global clock buffer 204 with the configurable route portion 234' of the third BIST ring shown in FIG. 2E.

Therefore, the ring delay of the fourth BIST ring minus the ring delay of the third BIST ring delay equals the skew from one end (i.e. the right (edge) tap point 226') to the other end (i.e. left (center) tap point 228') of the spine 231 of the regional clock tree driven by regional clock buffer 218, plus the delay [R2] through the second right routing portion 238' minus the delay [L2] through the second left routing portion 232', which is represented as:

$$D4-D3=skew+(L2-R2) \quad \text{Eq. 2}$$

Combining equations 1 and 2 yields:

$$(D4-D3)+(D2-D1)=skew+(L2-R2)+skew+(R1-L1) \quad \text{Eq. 3}$$

$$=2*skew$$

Thus, by measuring D1, D2, D3, and D4 one obtains the skew from one end of the regional clock tree spine (either 224 or 224') to the other end. This example assumes that the regional clock buffers on the left and right edges of the IC are essentially identical, and that the delays on both the left and right sides of the global clock tree are the same. While an embodiment has been illustrated with an FPGA, embodiments of the invention are practiced using other ICs that have sufficient symmetry, or are sufficiently configured, so that L1 essentially equals R2 and R1 essentially equals L2 in terms of delay through those path segments. It is noted that other forms of the above equation are alternatively used to obtain the skew. Using the global clock provides the same delay from the global clock buffer 204 to both regional clock buffers 216, 218.

Figure 3:
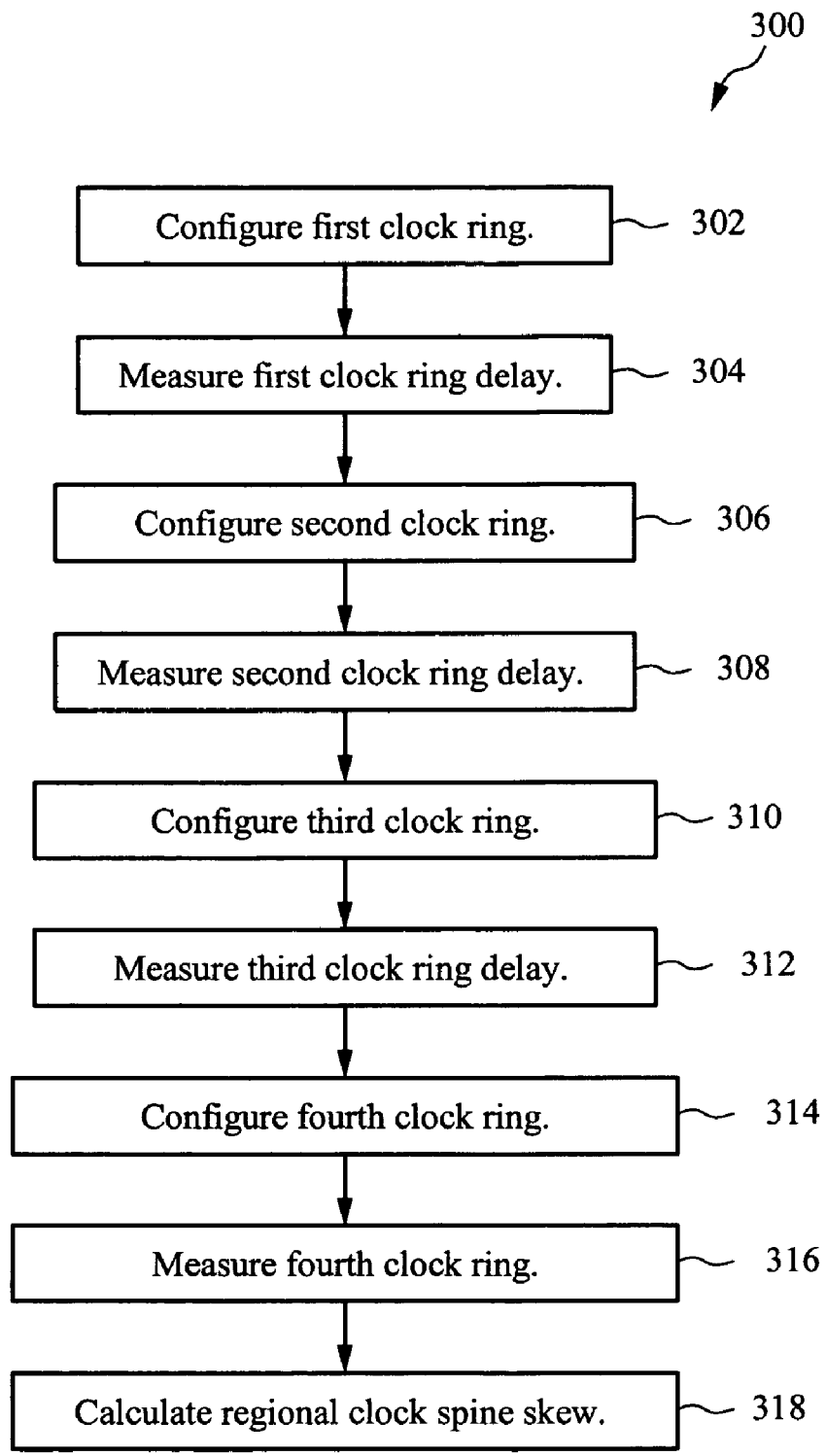
FIG. 3 is a simplified flow chart of a method of measuring skew in an asymmetric clock tree according to an embodiment of the present invention.

FIG. 3 is a simplified flow chart of a method of measuring skew in an asymmetric clock tree according to an embodiment of the present invention. A first clock ring is configured in a configurable logic device through a first spine of a global clock tree, a first regional clock buffer of a first regional clock tree, a first edge flip-flop, a first edge-to-block route, a first block, and a first block-to-global clock buffer route (step 302). Alternatively, embedded BIST rings are defined in a device, such as a microprocessor, ROM, or RAM. A first delay around the first clock ring is measured (step 304). A second clock ring is configured in the configurable logic device through the first spine of the global clock tree, the first regional clock buffer, a spine of the first regional clock tree, a first center flip-flop, a first center-to-block route, the first block, and the first block-to-global clock buffer route (step 306). A second delay around the second clock ring is measured (step 308).

A third clock ring is configured in the configurable logic device through a second spine of the global clock tree, a second regional clock buffer of a second regional clock tree, a second edge flip-flop, a second edge-to-block route, a second block, and a second block-to-global clock buffer route (step 310). A third delay around the third clock ring is measured (step 312).

A fourth clock ring is configured in the configurable logic device through the second spine of the global clock tree, the second regional clock buffer, a spine of the second regional clock tree, a second center flip-flop, a second center-to-block route, the second block, and the second block-to-global clock buffer route (step 314). A fourth delay around the fourth clock ring is measured (step 316), and a skew from a first end of the spine of the first regional clock tree (or alternatively the spine of the second regional clock tree) is calculated from the first delay, second delay, third delay, and fourth delay (step 318).

While the present invention has been described in connection with specific embodiments, variations of these embodiments will be obvious to those of ordinary skill in the art. For example, the invention can be adapted for use with other types of ICs, such as fixed (embedded) circuits, combined fixed and programmable circuits, an/or flash-programmable circuits, for example. Moreover, some components are shown directly connected to one another. The method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

The invention claimed is:

1. An integrated circuit comprising:
   a global clock buffer having a global clock buffer input;
   a first regional clock buffer having a first regional clock buffer input and a first regional clock buffer output;
   a global clock tree having a global clock tree trunk portion connected to the global clock buffer and a first global clock tree spine connected to and extending from the global clock tree trunk portion, the first global clock tree spine coupling a clock signal from the global clock buffer to the first regional clock buffer input;
   a first regional clock tree having a first regional clock tree trunk portion electrically connected to the first regional clock buffer output and a first regional clock tree spine connected to and extending from the first regional clock tree trunk portion, the first regional clock tree spine having a first end and a second end;
   a first flip-flop proximate and electrically connected to the first end of the first regional clock tree spine;

a circuit block;
a first routing portion connecting the circuit block to the global clock buffer input; and
a second routing portion connecting the first flip-flop to the circuit block so as to form a first clock ring allowing measurement of a first clock ring delay of the first clock ring.

2. The integrated circuit of claim 1 wherein the first routing portion is a configurable path in a programmable logic device.

3. The integrated circuit of claim 2 wherein the programmable logic device is a field-programmable gate array.

4. The integrated circuit of claim 1 further comprising:
a second flip-flop proximate and electrically connected to the second end of the first regional clock tree spine; and
a third routing portion connecting the second flip-flop to the circuit block so as to form a second clock ring allowing measurement of a second clock ring delay of the second clock ring.

5. The integrated circuit of claim 4 wherein the first end of the first regional clock tree spine is nearest to the first regional clock buffer and the second end of the first regional clock tree spine is farthest from the first regional clock buffer and a difference between the second clock ring delay and the first clock ring delay equals a skew from the first end of the first regional clock tree spine to the second end of the first regional clock tree spine, plus a first delay along the third routing portion, minus a second delay along the second routing portion.

6. The integrated circuit of claim 4 further comprising:
a second regional clock buffer having a second regional clock buffer input and a second regional clock buffer output;
a second global clock tree spine connected to and extending from the global clock tree trunk portion coupling the clock signal from the global clock buffer to the second regional clock buffer input;
a second regional clock tree having a second regional clock tree trunk portion and a second regional clock tree spine connected to and extending from the second regional clock trunk portion, the second regional clock tree spine having a first end and a second end;
a third flip-flop nearest and electrically connected to the first end of the second regional clock tree spine;
a fourth flip-flop nearest and electrically connected to the second end of the second regional clock tree spine;
a second circuit block;
a fourth routing portion connecting the second circuit block to the global clock buffer;
a fifth routing portion connecting the third flip-flop to the second circuit block forming a third clock ring allowing measurement of a third clock ring delay; and
a sixth routing portion connecting the fourth flip-flop to the second circuit block forming a fourth clock ring allowing measurement of a fourth clock ring delay.

7. The integrated circuit of claim 6 wherein the first end of the second regional clock tree spine is nearest to the second regional clock buffer and the second end of the second regional clock tree spine is farthest from the second regional clock buffer and a difference between the fourth clock ring delay and the third clock ring delay equals a skew from the first end of the second regional clock tree spine to the second end of the second regional clock tree spine, plus a third delay along the fifth routing portion, minus a fourth delay along the sixth routing portion.

8. The integrated circuit of claim 7 wherein the first end of the first regional clock tree spine is nearest to the first regional clock buffer and the second end of the first regional clock tree spine is farthest from the first regional clock buffer and a difference between the second clock ring delay and the first clock ring delay equals a skew from the first end of the first regional clock tree spine to the second end of the first regional clock tree spine, plus a first delay along the third routing portion, minus a second delay along the second routing portion and the first delay is essentially equal to the third delay and the second delay is essentially equal to the fourth delay.

9. The integrated circuit of claim 6 wherein at least one of the first routing portion, the second routing portion, the third routing portion, the fourth routing portion, the fifth routing portion and the sixth routing portion is a configurable route through a configurable logic device.

10. The integrated circuit of claim 6 wherein each of the first routing portion, the second routing portion, the third routing portion, the fourth routing portion, the fifth routing portion and the sixth routing portion are configured through a configurable logic device.

11. A method of measuring skew in an asymmetric clock tree comprising:
configuring a first clock ring through at least a global clock buffer and a first regional clock buffer in a programmable logic device, the first clock ring being configured from a first tap of a first regional clock tree spine to the global clock buffer;
measuring a first delay around the first clock ring;
configuring a second clock ring through at least the global clock buffer, the first regional clock buffer, and at least a portion of the first regional clock tree spine in the programmable logic device, the second clock ring being configured from a second tap of the first regional clock tree spine to the global clock buffer;
measuring a second delay around the second clock ring;
configuring a third clock ring through at least the global clock buffer and a second regional clock buffer in the programmable logic device, the third clock ring being configured from a third tap of a second regional clock tree spine to the global clock buffer;
measuring a third delay around the third clock ring;
configuring a fourth clock ring through the global clock buffer, the second regional clock buffer, and at least a portion of the second regional clock tree spine in the programmable logic device, the fourth clock ring being configured from a fourth tap of the second regional clock tree spine to the global clock buffer;
measuring a fourth delay around the fourth clock ring; and
calculating a skew along the first regional clock spine of the programmable logic device according to a first difference between the fourth delay and the third delay to a second difference between the second delay and the first delay to produce a sum, and dividing the sum in half.

12. The method of claim 11 wherein the first clock ring includes a first block, a first route from the first tap to the first block having a first route delay, and a second route from the first block to the global clock buffer having a second route delay.

13. The method of claim 12 wherein the second clock ring includes at least a portion of the first regional clock tree spine the first block, a third route from the second tap to the first block having a third route delay, and the second route from the first block to the global clock buffer having the second route delay.

14. The method of claim 13 wherein the third clock ring includes a second block, a fourth route from the third tap to the second block having the first route delay, a fifth route from the second block to the global clock buffer having a fifth route delay, and the fourth clock ring includes at least a portion of the second regional clock tree spine, a sixth route from the fourth tap to the second block having a sixth route delay, and the fifth route from the second block to the global clock buffer having the fifth route delay.

15. The method of claim 14 wherein the first tap is at a first end of the first regional clock tree spine, the second tap is at a second end of the first regional clock tree spine, the third tap is at a first end of the second regional clock tree spine, the fourth tap is at a second end of the second regional clock tree spine, and the skew is a clock skew from the first end of the first regional clock tree spine to the second end of the first regional clock tree spine.

* * * * *